United States Patent
Kim

(10) Patent No.: US 7,034,452 B2
(45) Date of Patent: *Apr. 25, 2006

(54) DUAL-TYPE ORGANIC ELECTROLUMINESCENCE DISPLAY AND MANUFACTURING METHOD THEREOF

(75) Inventor: Tae Seung Kim, Busan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 218 days.

This patent is subject to a terminal disclaimer.

(21) Appl. No.: 10/665,044

(22) Filed: Sep. 22, 2003

(65) Prior Publication Data
US 2004/0056587 A1    Mar. 25, 2004

(30) Foreign Application Priority Data
Sep. 19, 2002 (KR) ............... 10-2002-0057389

(51) Int. Cl.
*H01J 1/62* (2006.01)

(52) U.S. Cl. ............ 313/500; 313/506; 313/493; 313/512; 315/169.3

(58) Field of Classification Search ........... 313/500, 313/504, 506, 508, 498, 483, 493, 512; 315/169.1, 315/169.3

See application file for complete search history.

(56) References Cited

U.S. PATENT DOCUMENTS

| | | | |
|---|---|---|---|
| 5,416,494 A * | 5/1995 | Yokota et al. | 345/79 |
| 6,433,487 B1 * | 8/2002 | Yamazaki | 315/169.3 |
| 6,548,956 B1 * | 4/2003 | Forrest et al. | 313/504 |
| 6,879,096 B1 * | 4/2005 | Miyazaki et al. | 313/495 |
| 2003/0227254 A1 * | 12/2003 | Terumoto | 313/504 |
| 2004/0036412 A1 * | 2/2004 | Takamura | 313/506 |

FOREIGN PATENT DOCUMENTS

| | | |
|---|---|---|
| JP | 10-255974 | 9/1998 |
| JP | 2000-58260 | 2/2000 |
| JP | 2000-100560 | * 4/2000 |
| JP | 2001-332392 | 11/2001 |

* cited by examiner

Primary Examiner—David V. Bruce
Assistant Examiner—Elizabeth Keaney
(74) Attorney, Agent, or Firm—Stein, McEwen & Bui, LLP

(57) ABSTRACT

A dual-type organic EL display including: a main organic EL device including a main substrate, strip-shaped main substrate scan lines, a main substrate organic light-emitting portion, and main substrate data lines formed on the main substrate; a sub organic EL device opposite to and facing the main organic EL device, including a sub substrate, strip-shaped sub substrate scan lines, a sub substrate organic light-emitting portion, and sub substrate data lines formed on the sub substrate; a sealant including a conductive spacer, sealing the main and sub substrates and hermetically sealing the main and sub substrate organic light-emitting portions in a state in which the main and sub organic El devices face each other; and at least one flexible printed cable (FPC) formed on the main or sub substrate and connected to electrode lines of the main and/or sub substrates.

28 Claims, 9 Drawing Sheets

DUAL-TYPE ORGANIC ELECTROLUMINESCENCE DISPLAY AND MANUFACTURING METHOD THEREOF

CROSS-REFERENCE TO RELATED APPLICATIONS

This application claims the benefit of Korean Patent Application No. 2002-57389, filed on Sep. 19, 2002, in the Korean Intellectual Property Office, the disclosure of which is incorporated herein reference.

BACKGROUND OF THE INVENTION

1. Field of the Invention

The present invention relates to a dual-type organic electroluminescence (EL) display and a manufacturing method thereof, and, more particularly, to a dual-type organic electroluminescence display having an improved connection structure of a flexible printed cable electrically connected to terminals provided at main and sub organic EL displays and an improved driving method, and a manufacturing method thereof.

2. Description of the Related Art

In general, organic EL displays are spontaneous light-emitting display devices which emit light through electrical excitation of fluorescent organic compounds, and provide various advantages including a low drive voltage and thin film formability. Also, organic EL displays are attracting much attention as next-generation display panels, since they provide a wide viewing angle, a fast response time, and so on.

An organic EL display operates as follows. When power is supplied, electrons migrate and current flows. At a cathode, electrons migrate to a light-emitting layer through an electron transport layer. At an anode, holes migrate to the light-emitting layer through a hole transport layer. The electrons and holes migrating to the light-emitting layer generate excitons having high energy. The excitons are deactivated to a ground state and thus light is emitted. Full color display can be achieved according to the kinds of an organic material forming the light-emitting layer.

Recently, users have desired dual type organic EL displays capable of simultaneously displaying two images in a folder type electronic device. The structure of the dual-type organic EL display is well known in Japanese Patent Application Laid-Open Nos. hei 10-255974, 2000-58260 and 2001-332392.

FIG. 1 shows a conventional dual type organic EL display.

Referring to FIG. 1, the dual-type organic EL display includes a main organic EL device 10 and a sub organic EL device 100.

The main organic EL device 10 includes a substrate 11, an organic light-emitting portion 12 formed on the substrate 11, a cap 13 protecting the organic light-emitting portion 12, a moisture absorbent 14 installed in the cap 13 and a polarizing plate 15 installed in front of the substrate 11.

The sub organic EL device 100 connected to the main organic EL device 10 has substantially the same structure as that of the main organic EL device 10, and includes a substrate 110, an organic light-emitting portion 120, a cap 130, a moisture absorbent 140 and a polarizing plate 150.

In order to allow a user to selectively look at two displays in different directions indicated by arrows, the dual-type organic EL display has the sub organic EL device 100 connected to the rear surface of the main organic EL device 10.

For example, folder-type electronic devices can utilize external panel information directly displayed on a window without special manipulation just by employing a dual-type display device, and can utilize panel information displayed on another window by simple manipulation.

A process of manufacturing the dual-type organic EL display having the above-described configuration will now be briefly described.

A substrate 11 for the main organic EL device 10 is first provided. An organic light-emitting portion 12, including an anode, an insulator layer, an organic layer and a cathode, is then patterned on the substrate 11. A cap 13 for protecting the resultant structure is mounted, and a polarizing plate 15 is attached to the front surface of the substrate 11. In order to remove moisture generated in a sealed space, a moisture absorbent 14 is provided inside the cap 13.

Also, on a substrate 110 for the sub organic EL device 100, an organic light-emitting portion 120, a cap 130 provided with a moisture absorbent 140, and a polarizing plate 150 are mounted.

Next, the main and sub organic EL devices 10 and 100 are connected to each other in a state in which display portions are opposite to and face each other.

In the respective substrates 11 and 110 of the main and sub organic EL devices 10 and 100, electrode lines having a predetermined pattern are formed.

FIG. 2A shows electrode lines of the main organic EL device 10 shown in FIG. 1, and FIG. 2B shows electrode lines of the sub organic EL device 100 shown in FIG. 1.

Referring to FIGS. 2A and 2B, strip-shaped main substrate scan lines 21 and strip-shaped main substrate data lines 22 crossing the main substrate scan lines 21 are arranged on the substrate 11 for the main organic EL device 10, the respective lines spaced a predetermined distance from each other. The main substrate scan and data lines 21 and 22 are electrodes of the organic light-emitting portion 12. Strip-shaped sub substrate scan lines 210 and strip-shaped sub substrate data lines 220 parallel to the sub substrate scan lines 210 are arranged on the substrate 110 for the sub organic EL device 100, the respective lines spaced a predetermined distance from each other. The sub substrate scan and data lines 210 and 220 are grouped at a first side of the substrate 110.

Flexible printed cables (FPCs) are connected to the main and sub organic EL devices 10 and 100, having the respective electrode lines, applying external power, as shown in FIGS. 3A and 3B.

As shown in FIG. 3A, the main substrate scan lines 21 and the main substrate data lines 22 are arranged at two sides of the substrate for the main organic EL device 10. An FPC 31 for the main substrate scan lines 21 and an FPC 34 for the main substrate data lines 22 are connected to the main substrate scan and data lines 21 and 22, respectively.

Interconnections 32 for the main substrate scan lines 21 and interconnections 35 for the main substrate data lines 22 are patterned in the FPCs 31 and 34, respectively, and at least one drive chip 33, 36, driving both the main substrate scan and data lines 21 and 22, is provided.

As shown in FIG. 3B, the sub substrate scan lines 210 and the sub substrate data lines 220 are drawn to a first side of the substrate 110 for the sub organic EL device 100, and a sub substrate FPC 37 is connected to the sub substrate scan lines 210 and the sub substrate data lines 220. Sub substrate interconnections 38 are patterned in the sub substrate FPC 37, and a drive chip 39 for driving both the sub substrate scan and data lines 210 and 220 is disposed at the sub substrate FPC 37.

The conventional dual-type organic EL display has the following problems.

First, the caps 13 and 130, incorporating the respective moisture absorbents 14 and 140, are installed at a connected portion of the main organic EL device 10 and the sub organic EL device 100. The heights of the caps 13 and 130 are combined, resulting in an increase in the overall thickness of the dual-type organic EL display. Therefore, since there is a limitation in thinning, satisfactorily lightweight, miniaturized electronic devices cannot be obtained.

Second, since the FPCs 31 and 34 connected to the main substrate scan and data lines 21 and 22 of the main organic EL device 10, the drive chips 33 and 36 mounted thereon, the sub substrate FPC 37 connected to the sub substrate scan and data lines 210 and 220 of the sub organic EL device 100, and at least one drive chip 39 mounted on the FPC 37, are all necessary, the design of the drive chips 33, 36 and 39 is complicated, resulting in an increase in cost.

SUMMARY OF THE INVENTION

The present invention provides a dual-type organic electroluminescence (EL) display having an improved connection structure between scan and data lines thereof and a flexible printed cable electrically connected thereto, the dual-type organic EL display capable of driving images independently at two effective screens, and a manufacturing method thereof.

Additional aspects and/or advantages of the invention will be set forth in part in the description which follows and, in part, will be obvious from the description, or may be learned by practice of the invention.

In an aspect of the present invention, there is provided a dual-type organic electroluminescence (EL) display comprising a main organic EL device comprising a main substrate, strip-shaped main substrate scan lines, a main substrate organic light-emitting portion, and main substrate data lines formed on the main substrate, a sub organic EL device opposite to and facing the main organic EL device, comprising a sub substrate, strip-shaped sub substrate scan lines, a sub substrate organic light-emitting portion, and sub substrate data lines formed on the sub substrate, a sealant comprising a conductive spacer, sealing the main and sub substrates and hermetically sealing the main and sub substrate organic light-emitting portions in a state in which the main and sub organic EL devices face each other, and at least one flexible printed cable (FPC) formed on the main or sub substrate and connected to electrode lines of the main and/or sub substrates.

In another aspect of the present invention, there is provided a dual-type organic electroluminescence (EL) display comprising a main organic EL device comprising a main substrate, strip-shaped main substrate scan lines, a main substrate organic light-emitting portion, and main substrate data lines formed on the main substrate, a sub organic EL device opposite to and facing the main organic EL device, comprising a sub substrate, strip-shaped sub substrate scan lines, a sub substrate organic light-emitting portion, and sub substrate data lines formed on the sub substrate, a sealant comprising a conductive spacer, sealing the main and sub substrates and hermetically sealing the main and sub substrate organic light-emitting portions in a state in which the main and sub organic EL devices face each other, floating electrode lines formed on the main or sub substrate and connected to electrode lines on the remaining main or sub substrate, and at least one flexible printed cable (FPC) connected to the main and/or sub substrate, wherein a plurality of the electrode lines on the main and sub substrates are electrically connected to each other by the conductive spacer.

In still another aspect of the present invention, there is provided a method of manufacturing a dual-type organic EL display comprising preparing a main organic EL device by forming main substrate scan lines, a main substrate insulating layer, a main substrate organic layer, and main substrate data lines crossing the main substrate scan lines on a transparent main substrate, preparing a sub organic EL device by forming sub substrate scan lines, a sub substrate insulating layer, a sub substrate organic layer, and sub substrate data lines crossing the sub substrate scan lines on a transparent sub substrate, aging the main and sub organic EL devices, sealing along the periphery of an effective display area to hermetically seal the main and sub organic EL devices so as not to be exposed to outside elements, wherein the sealant comprises a conductive spacer, and connecting flexible printed cables (FPCs) transmitting a drive signal to at least one of the main and sub substrate scan lines and/or at least one of the the main and sub substrate data lines electrically connected to each other by the sealant.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
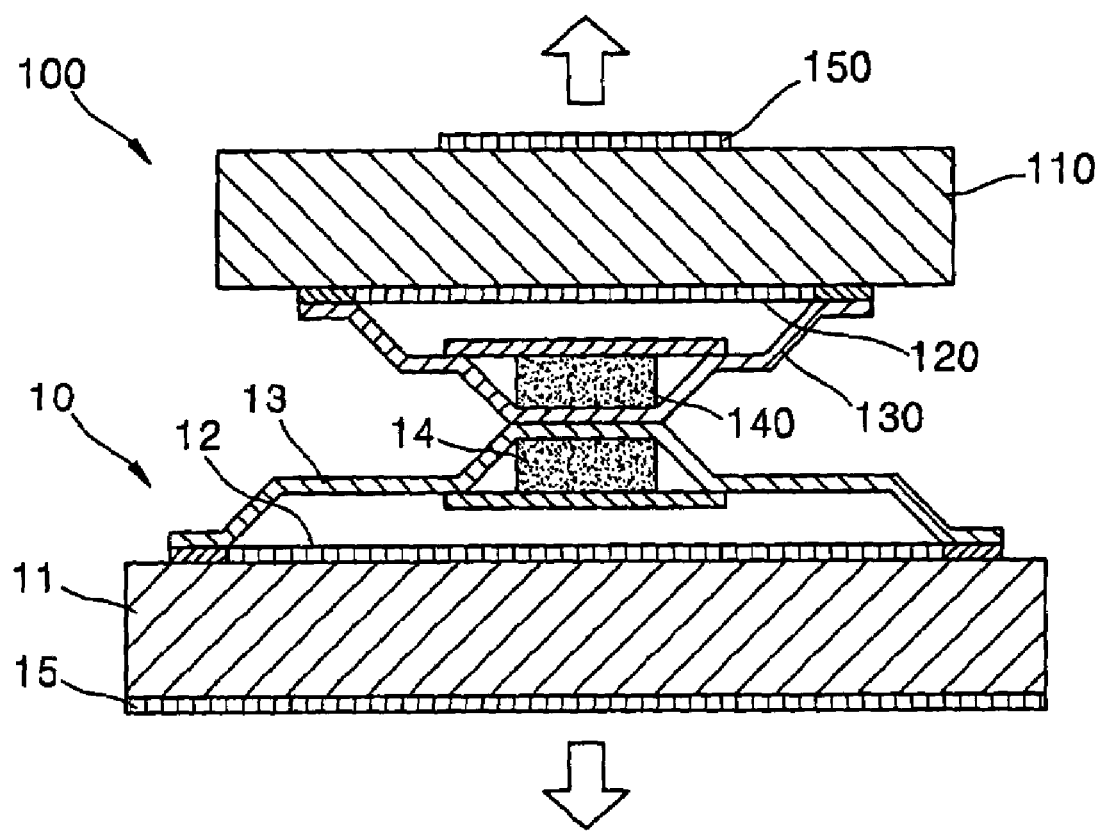
FIG. 1 is a cross-sectional view of a conventional dual-type organic EL display.
Figure 2A:
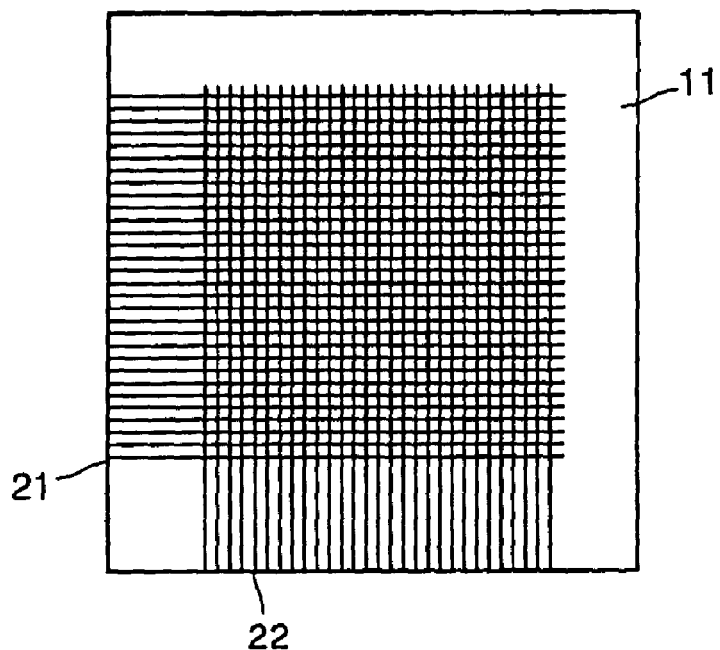
FIG. 2A is a schematic diagram of electrode lines of a main organic EL device shown in FIG. 1.
Figure 2B:
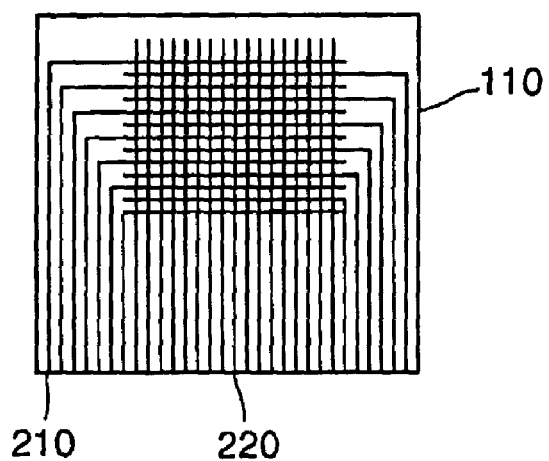
FIG. 2B is a schematic diagram of electrode lines of a sub organic EL device shown in FIG. 1.
Figure 3A:
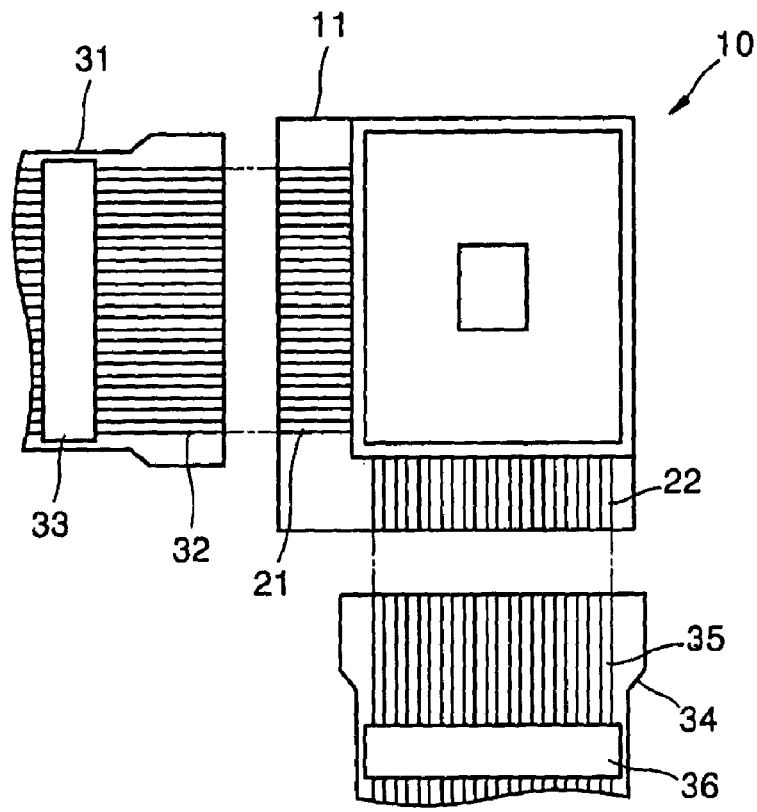
FIG. 3A is a schematic diagram of the main organic EL device shown in FIG. 1.
Figure 3B:
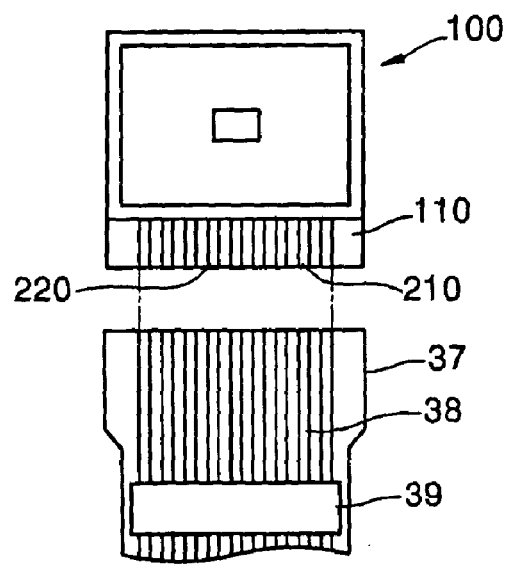
FIG. 3B is a schematic diagram of the sub organic EL device shown in FIG. 1.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 4:
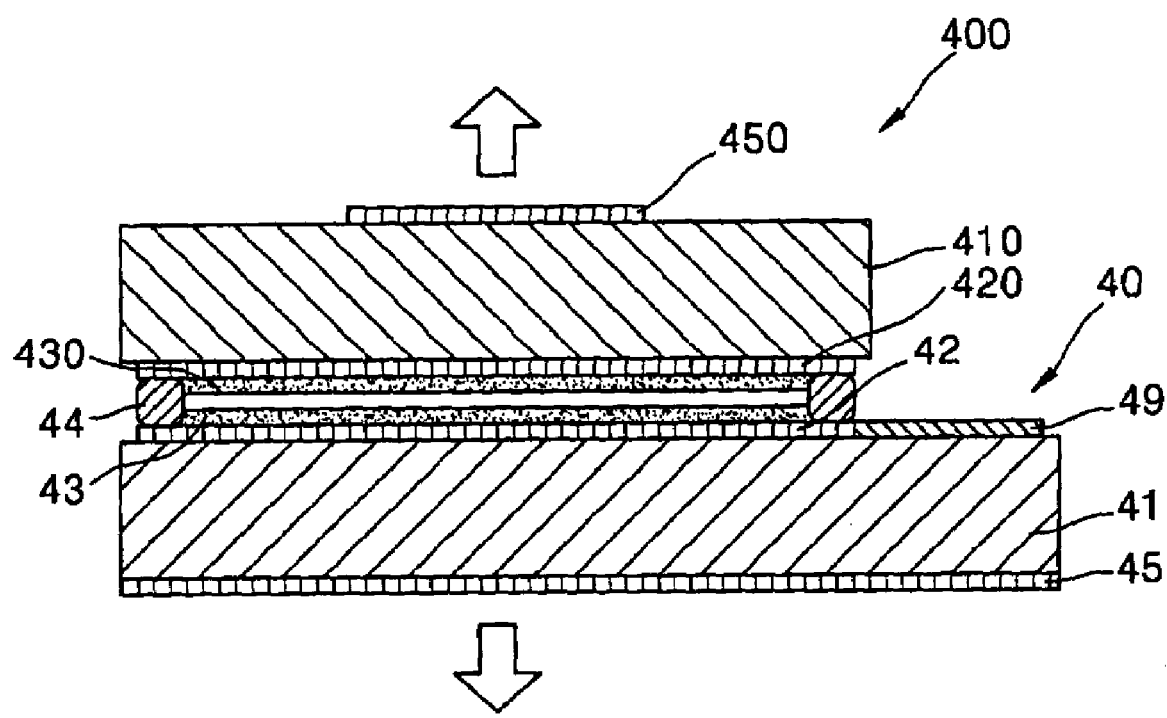
FIG. 4 is a cross-sectional view of a dual-type organic EL display according to an embodiment of the present invention.

FIG. 4 is a cross-sectional view of a dual-type organic EL display according to an embodiment of the present invention.

Referring to FIG. 4, the dual-type organic EL display includes a main organic EL device 40 and a sub organic EL device 400 connected to the main organic EL device 40, so display images are projected on two displays as indicated by the arrows.

A transparent main substrate 41 is provided in the main organic EL device 40, and a main substrate organic light-emitting portion 42 is formed on the main substrate 41.

The main substrate organic light-emitting portion 42 includes main substrate scan lines as first electrode lines, a main substrate insulating layer formed to expose the main substrate scan lines, a main substrate organic layer crossing the main substrate insulating layer, and main substrate data lines as second electrode lines formed on the main substrate organic layer.

The main substrate organic light-emitting portion 42 is covered by a main substrate passivation layer 43, e.g., a transparent epoxy, in order to prevent external moisture from infiltrating. A main polarizing plate 45 is attached to the front surface of the main substrate 41.

Also, a sub substrate 410 is provided in the sub organic EL device 400, and a sub substrate organic light-emitting portion 420 is formed on the sub substrate 410.

The sub substrate organic light-emitting portion 420 includes sub substrate scan lines as third electrode lines, a sub substrate insulating layer, a sub substrate organic layer, and sub substrate data lines as fourth electrode lines.

The sub substrate organic light-emitting portion 420 is covered by the sub substrate passivation layer 430, and a sub polarizing plate 450 is attached to the front surface of the sub substrate 410.

The sub substrate organic light-emitting portion 420 and the sub substrate passivation layer 430 formed on the sub substrate 410 are opposite to and face the main substrate organic light-emitting portion 42 and the main substrate passivation layer 43 formed on the main substrate 41. A moisture absorbent sheet may be additionally installed between the main and sub substrate passivation layers 43 and 430.

On the main substrate 41 are provided the main substrate organic light-emitting portion 42 and electrode lines 49 selectively electrically connected to the sub substrate organic light-emitting portion 420, and electrically connected to the main substrate organic light-emitting portion 42.

A sealant 44 is provided at a connected portion of the main and sub organic EL devices 40 and 400 on either substrate for hermetically sealing the area containing the light emitting portions 42 and 420. The sealant 44 is applied on the substrate along the periphery of an outer region of an effective display portion.

The sealant 44 may be formed on only one of the main and sub substrates 41 and 410, rather than on both, in view of simplicity of the manufacturing process.

Meanwhile, the sealant 44 includes a conductive spacer so that the main and sub substrate organic light-emitting portions 42 and 420 can be selectively electrified through the electrode lines 49, which will later be described in detail.

In the aforementioned dual-type organic EL display, the facing main and sub substrates 41 and 410 can be connected to each other without installation of a cap which may increase the overall thickness, thereby greatly reducing the thickness of the device. Also, the main and sub substrate organic light-emitting portions 42 and 420 are covered by the main and sub substrate passivation layers 43 and 430, respectively, thereby preventing the infiltration of external moisture.

Figure 5:
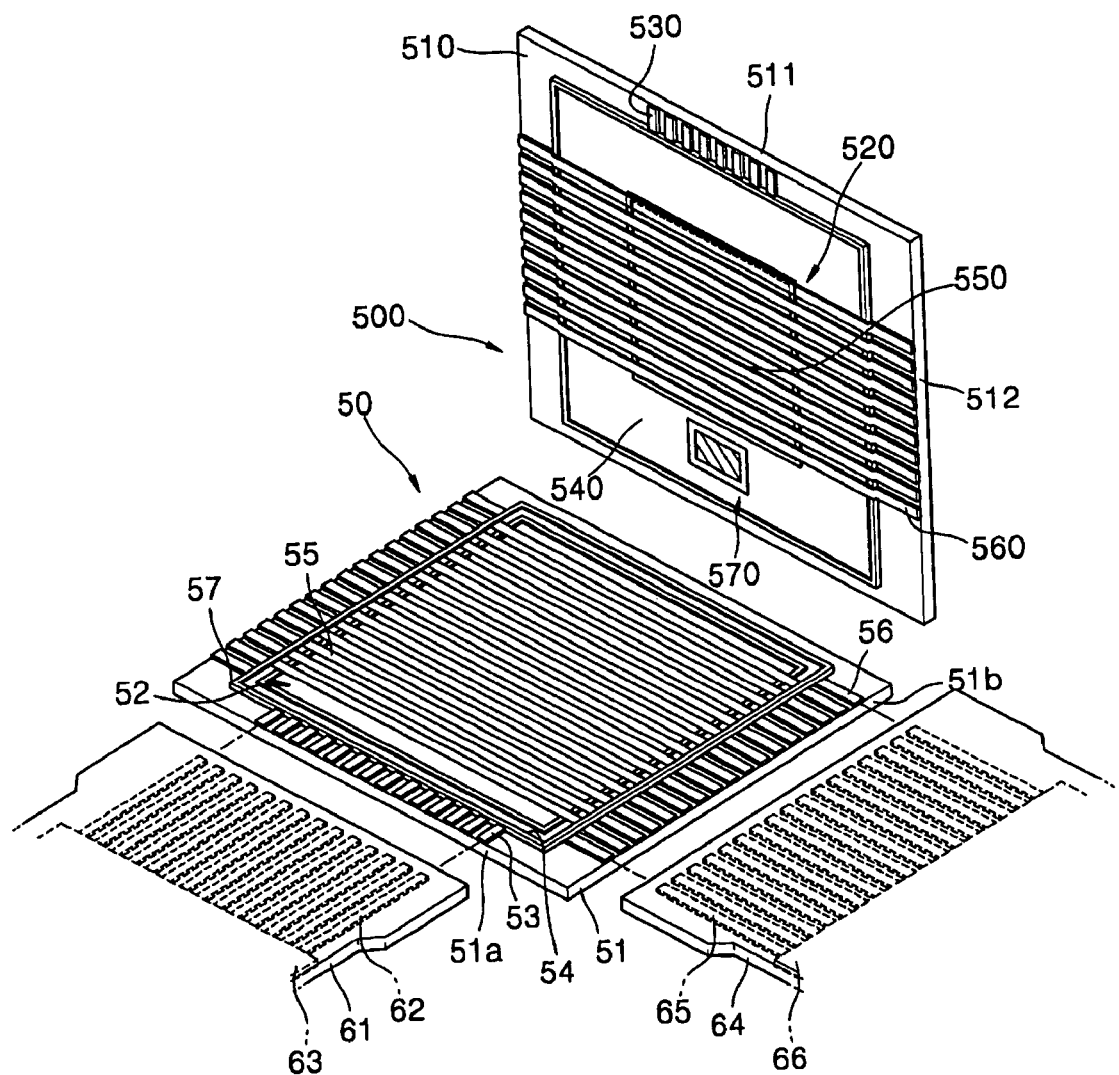
FIG. 5 is a cross-sectional view of a dual-type organic EL display according to another embodiment of the present invention.
Figure 6A:
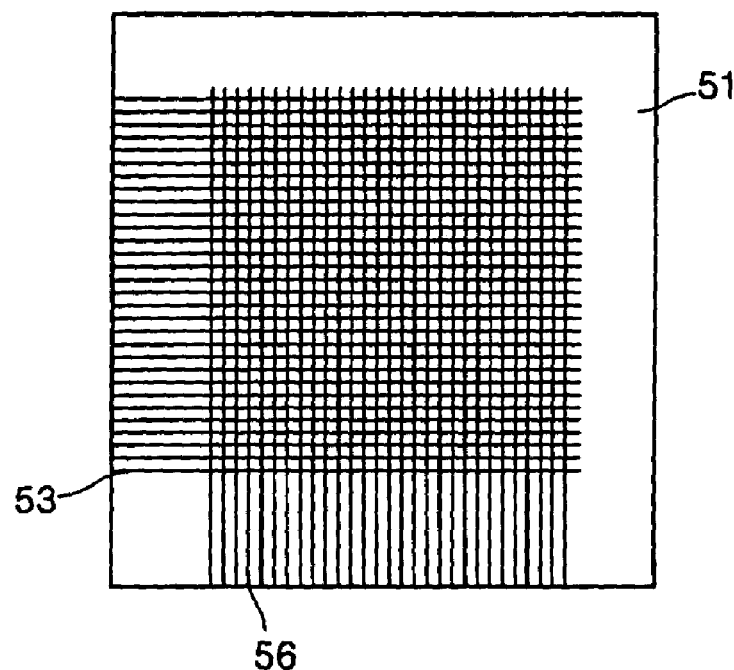
FIG. 6A is a schematic diagram of electrode lines of a main organic EL device shown in FIG. 5.
Figure 6B:
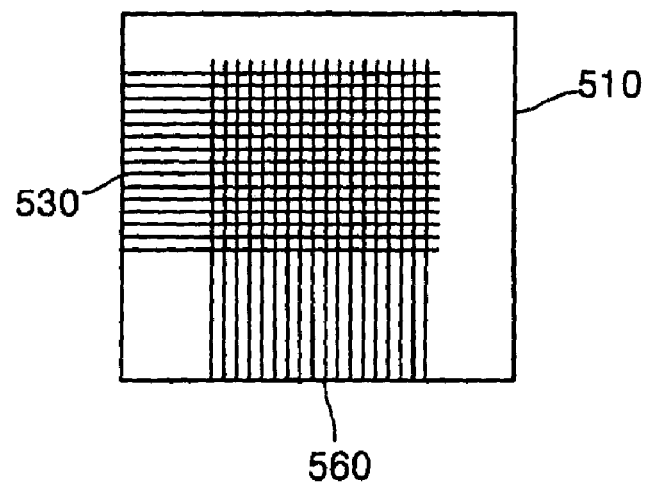
FIG. 6B is a schematic diagram of electrode lines of a sub organic EL device shown in FIG. 5.

FIG. 5 is a cross-sectional view of a dual-type organic EL display according to another embodiment of the present invention, FIG. 6A is a schematic diagram of electrode lines of a main organic EL device shown in FIG. 5, and FIG. 6B is a schematic diagram of electrode lines of a sub organic EL device shown in FIG. 5.

Referring to FIGS. 5, 6A and 6B, the dual-type organic EL display includes a main organic EL device 50 and a sub organic EL device 500 opposite to and facing the main organic EL device 50, thereby allowing image display on two screens.

In the main organic EL device 50, there is provided a main substrate 51 made of a transparent material for transmitting light, and a main substrate organic light-emitting portion 52 is formed on the main substrate 51.

The main substrate organic light-emitting portion 52 includes strip-shaped main substrate scan lines 53 as first electrode lines, a main substrate insulating layer 54, a main substrate organic layer 55, and strip-shaped main substrate data lines 56 as second electrode lines. The main substrate scan lines are spaced a predetermined distance from each other and are formed on the main substrate 51. The main substrate insulating layer 54 is formed on the plane of the main substrate 51 having the main substrate scan lines 53, forming pixels. The main substrate organic layer 55 is formed so as to cross the main substrate scan lines 53. The main substrate data lines 56 are spaced a predetermined distance from each other on the main substrate organic layer 55. The main substrate scan and data lines 53 and 56 cross each other.

The sub organic EL device 500 also has a sub substrate 510 made of a transparent material. A sub substrate organic light-emitting portion 520 is formed on the sub substrate 510. The sub substrate organic light-emitting portion 520 has substantially the same structure as that of the main substrate organic light-emitting portion 52.

That is to say, the sub substrate organic light-emitting portion 520 includes sub substrate scan lines 530 as third electrode lines, a sub substrate insulating layer 540, a sub substrate organic layer 550, and sub substrate data lines 560 as fourth electrode lines, the sub substrate scan and data lines 530 and 560 crossing each other.

A sealant 57 for connecting rear surfaces of the main and sub organic EL devices 50 and 500 is coated along the peripheries of outer regions of effective display areas of the main and sub substrates 51 and 510 to prevent the main and sub substrate organic light-emitting portions 52 and 520 from being exposed to outside elements, thereby preventing the infiltration of external moisture. The sealant 57 includes a conductive spacer.

In order to prevent the main and sub substrate organic layers 55 and 550 of the main and sub substrate organic light-emitting portions 52 and 520 from being damaged due to the moisture infiltrating through the sealant 57, a moisture absorbent 570 is provided at a sealed area defined by the sealant 57. The moisture absorbent 570 is installed within a recess formed at an edge of the sub substrate organic light-emitting portion 520. In order to prevent escape of the moisture absorbent 570, a porous tape is attached thereto.

Here, the main substrate scan lines 53 are spaced a predetermined distance from each other along a first side 51a of the main substrate 51, and the main substrate data lines 56 are disposed along a second side 51b of the main substrate 51. The sub substrate scan lines 530 are disposed along a first side 511 of the sub substrate 510, and the sub substrate data lines 560 are disposed along a second side 512 of the sub substrate 510.

FPCs are connected to either the main or sub substrate 51 or 510, applying external power to drive both the main organic EL device 50 and the sub organic EL device 500.

In other words, an FPC 61 for single substrate scan lines and an FPC 64 for single substrate data lines, connected to the main substrate scan and data lines 53 and 56, respectively, are provided on the main substrate 51. The FPC 61 can also be connected to the sub substrate scan lines 530. Also, the FPC 64 can be electrically connected to the sub substrate data lines 560. Interconnections 62 for scan lines and interconnections 65 for data lines are patterned in the FPCs 61 and 64, and at least one drive chip 63, 66, each connected to the FPC 61, 64, is provided to the interconnections 62 and 65.

Figure 7:
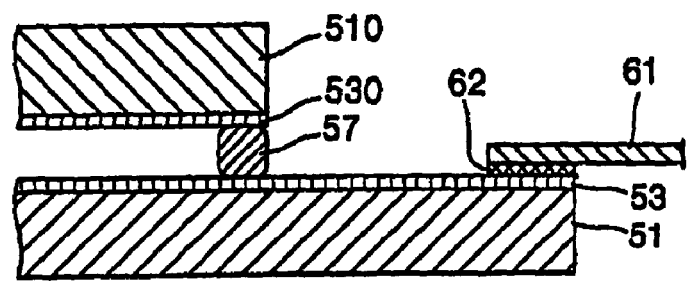
FIG. 7 is a cross-sectional view of a conductive spacer shown in FIG. 5.

Here, the sealant 57, coated along peripheries of the effective display areas of the main and sub organic EL devices 50 and 500, includes a conductive spacer. The sealant 57, including the conductive spacer, is coated between the main substrate scan lines 53 formed on the main substrate 51 and the sub substrate scan lines 530 formed on the sub substrate 510, and electrically connects the main and sub scan lines 53 and 530, as shown in FIG. 7. The sealant 57 is also coated between the main substrate data lines 56 and the sub substrate data lines 560.

The conductive spacer included in the sealant 57 is preferably formed of an anisotropic conductive material that produces conductivity vertically, but maintains an insulating property horizontally.

Accordingly, as shown in FIG. 5, the main and sub substrate scan lines 53 and 530 are spatially separated from each other, and when power is applied, current flows in both the main and sub substrate scan lines 53 and 530 through the FPC 61 for single substrate scan lines. The main and sub substrate data lines 56 and 560 are also spatially separated from each other.

As a result, the main organic EL device 50, and the sub organic EL device 500 connected to the main organic EL device 50 at rear surfaces thereof, can be driven by the FPC 61 for single substrate scan lines, and by the FPC 64 for single substrate data lines.

Here, the interconnections 62 patterned on the scan lines of FPC 61 are designed so as to correspond to and be connected to the main and sub substrate scan lines 53 and 530. Also, the interconnections 65 patterned on the data lines of FPC 64 are designed so as to correspond to and be connected to the main and sub substrate data lines 56 and 560.

In the aforementioned dual-type organic EL display, the sealant 57 includes a conductive spacer interposed between the main and sub substrate scan lines 53 and 530 and between the main and sub substrate data lines 56 and 560. Thus, the main and sub substrate scan lines 53 and 530 are spatially separated from each other, and so are the main and sub substrate data lines 56 and 560.

Thus, when power is applied to the FPCs 61 and 64 for single substrate scan lines and single substrate data lines, drawn out from the main substrate 51, in the case where the cover of the electronic device is closed, an image from the sub organic EL device 500 is driven. In the case where the cover of the electronic device is opened, an image from the main organic EL device 50 is driven. Here, current flows in both the main and sub organic EL devices 50 and 500.

A manufacturing method of the dual-type organic EL display will now be described.

First, the main substrate 51 of the main organic EL device 50 is provided. The main substrate 51 is preferably formed of a transparent material, e.g, glass. Strip-shaped main substrate scan lines 53 having a predetermined pattern are formed on the main substrate 51. The main substrate scan lines 53 are formed from a transparent conductive film, for example, an ITO film, through exposure, development, and etching using a photo mask having a pattern corresponding to that of the main substrate scan lines 53.

Next, the main substrate insulating layer 54 is formed on the main substrate 51 having the main substrate scan lines 53. The main substrate insulating layer 54 may be formed by a plurality of strips perpendicular to the main substrate scan lines 53 by photolithography. Otherwise, the main substrate insulating layer 54 may be formed over the entire surface of the main substrate 51 except a portion exposed to the first side 51a of the main substrate 51 so that the main substrate scan lines 53 for forming pixels are exposed in a predetermined pattern.

After forming the main substrate insulating layer 54, the main substrate organic layer 55 is formed on the resultant structure having the main substrate 51, the main substrate scan lines 53, and the main substrate insulating layer 54. When forming the main substrate organic layer 55, a hole transport layer, a light-emitting layer, and an electron transport layer are formed.

After forming the main substrate organic layer 55, strip-shaped main substrate data lines 56 are formed on the main substrate organic layer 55 in a direction perpendicular to the main substrate scan lines 53. The main substrate data lines 56 are preferably formed by depositing a highly conductive, metallic material, for example, aluminum, silver, or silver alloy.

While manufacturing the main organic EL device 50, the sub organic EL device 500 is manufactured in the same manner.

If the main organic EL device 50 and the sub organic EL device 500 are manufactured in such a manner, the respective devices 50 and 500 are aged. After aging, peripheries of the effective display areas of the main substrate 51 of the main organic EL device 50 and the sub substrate 510 of the sub organic EL device 500 are sealed by the sealant 57, thereby preventing the main substrate organic light-emitting portion 52 and the sub substrate organic light-emitting portion 520 from being exposed to outside elements.

Since a conductive spacer is included within the sealant 57, the main and sub substrate scan lines 53 and 530 are electrically connected to each other by the sealant 57. Also, the main and sub substrate data lines 56 and 560 are electrically connected to each other by the sealant 57.

Prior to sealing of the sealant 57, a recess is formed at a first side of the sub substrate 511 and is filled with the moisture absorbent 570, which is secured to the sub substrate 511 using a porous tape.

In the completed dual-type organic EL display, the FPC 61 for single substrate scan lines is connected to the main and sub substrate scan lines 53 and 530 drawn out to the first side 51a of the main substrate 51 and electrically connected by the sealant 57. Also, the FPC 64 for single substrate data lines is connected to the main and sub substrate data lines 56 and 560 drawn out to the second side 51b of the main substrate 51 and electrically connected by the sealant 57.

Accordingly, the main and sub organic EL devices 50 and 500 can be simultaneously driven by the FPCs 61 and 64 connected to one of the main and sub substrates (here, the main substrate 51).

Figure 8:
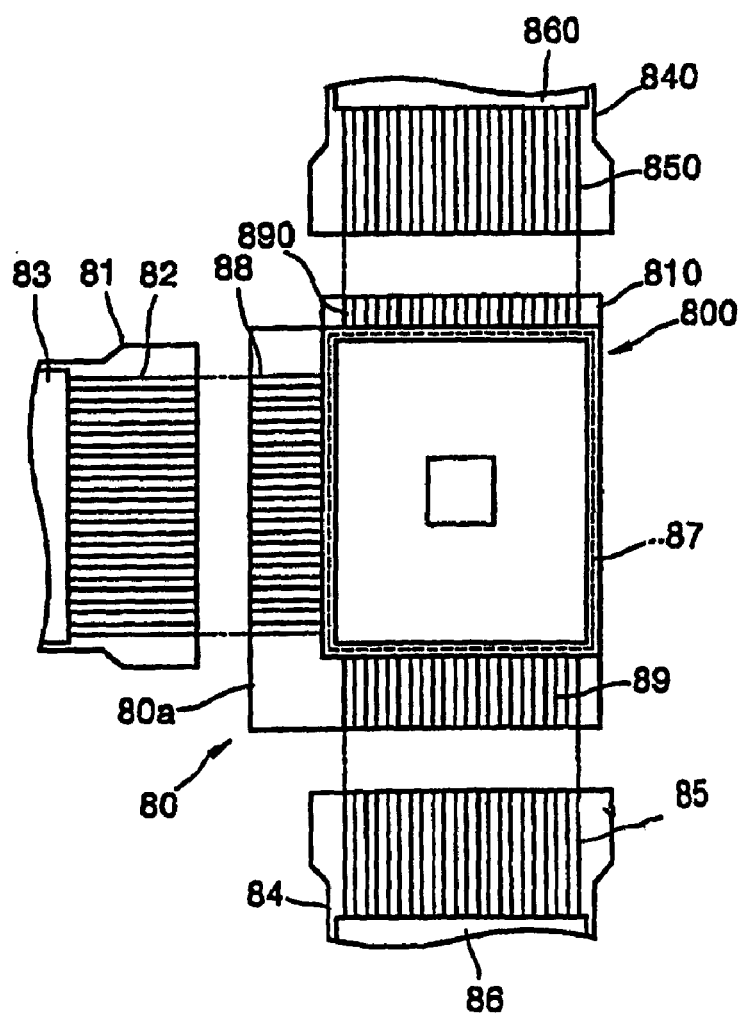
FIG. 8 is a cross-sectional view of a dual-type organic EL display according to still another embodiment of the present invention.

FIG. 8 is a cross-sectional view of a dual-type organic EL display according to still another embodiment of the present invention.

Referring to FIG. 8, the dual-type organic EL display includes a main organic EL device 80 and a sub organic EL device 800 opposite to and facing the main organic EL device 80.

Main substrate scan lines 88 and main substrate data lines 89 are formed on a main substrate 80a of the main organic EL device 80 so as to cross each other. A sub organic EL device 800 is connected to the surface of a main substrate 80a having a main substrate organic light-emitting portion. Sub substrate scan lines and sub substrate data lines 890 are formed on a sub substrate 810 of the sub organic EL device 800 so as to cross each other.

Here, main substrate scan lines 88 of the main substrate 80a and sub substrate scan lines patterned on the interior surface of the sub substrate 810 are electrically connected to each other by a sealant 87 coated on the periphery of an effective display area. The sealant 87 includes a conductive spacer made of an anisotropic conductive material. Such an anisotropic spacer has conductivity vertically only, and has an insulating property horizontally.

Accordingly, the main substrate scan lines 88 of the main substrate 80a and the sub substrate scan lines of the sub substrate 810 are spatially separated from each other by the sealant 87. An FPC 81 for main substrate scan lines, applying external power to drive both the main organic EL device 80 and the sub organic EL device 800, is provided at either a main substrate or a sub substrate. The FPC 81 is provided at the main substrate 80a in this embodiment. Interconnections 82 for scan lines are patterned on the FPC 81, and a drive chip 83 connected to the interconnections 82 is disposed thereat. The drive chip 83 is shared by the main substrate scan lines and the sub substrate scan lines, and the same scan signal is applied thereto.

Also, an FPC 84 is connected to the main substrate data lines 89 of the main substrate 80a. Interconnections 85 for the data lines are patterned on the FPC 84, and a drive chip 86, connected to the interconnections 85, is disposed at the FPC 84. The FPC 84 transmits an electrical signal from the drive chip 86 only to the main substrate data lines 89.

An FPC 840 is connected to the sub substrate data lines 890 of the sub substrate 810. Interconnections 850, corresponding to the sub substrate data lines 890, are patterned on the FPC 840, and a drive chip 860 connected to the interconnections 850 is disposed at the FPC 840. Therefore, an electrical signal externally applied is transmitted only to the sub substrate data lines 890 via the drive chip 860.

In the dual-type organic EL display according to the previously discussed embodiment of the present invention, as shown in FIG. 5, in a state in which the main substrate scan lines 53 and the sub substrate scan lines 530 are electrically connected to each other by the sealant 57, the FPC 61 is connected to the main substrate scan lines 53 drawn out from the main substrate 51, and the same signal is applied to the main substrate scan lines 53 and the sub substrate scan lines 530. Also, in a state in which the main substrate data lines 56 and the sub substrate data lines 560 are electrically connected to each other by the sealant 57, the FPC 64 is connected to the main substrate data lines 56, and the same signal is applied to the main substrate data lines 56 and the sub substrate data lines 560, thereby realizing the same image.

In the dual-type organic EL display according to the currently discussed embodiment of the present invention, as shown in FIG. 8, the main substrate scan lines 88 and the sub substrate scan lines are electrically connected to each other by the sealant 87, and the FPC 81 for scan lines is connected to the main substrate scan lines 88 drawn out from the main substrate 80a, so that the drive chip 83 can be shared by the main substrate scan lines 88 and the sub substrate scan lines and the same signal is applied thereto.

However, in this embodiment, the FPC 84 for single substrate data lines is connected to the main substrate data lines 89, and the FPC 840 is connected to the sub substrate data lines 890.

Accordingly, a signal for displaying an image from the sub organic EL device 800 when the cover of the dual-type organic EL display is closed, and for displaying an image from the main organic EL device 80 when the cover is opened, can be selectively applied to the dual-type organic EL display.

Since the main substrate data lines 89 formed on the main substrate 80a and the sub substrate data lines 890 formed on the sub substrate 810 are connected to the FPCs 84 and 840 for the respective main and sub substrate data lines, they can be independently driven.

Figure 9:
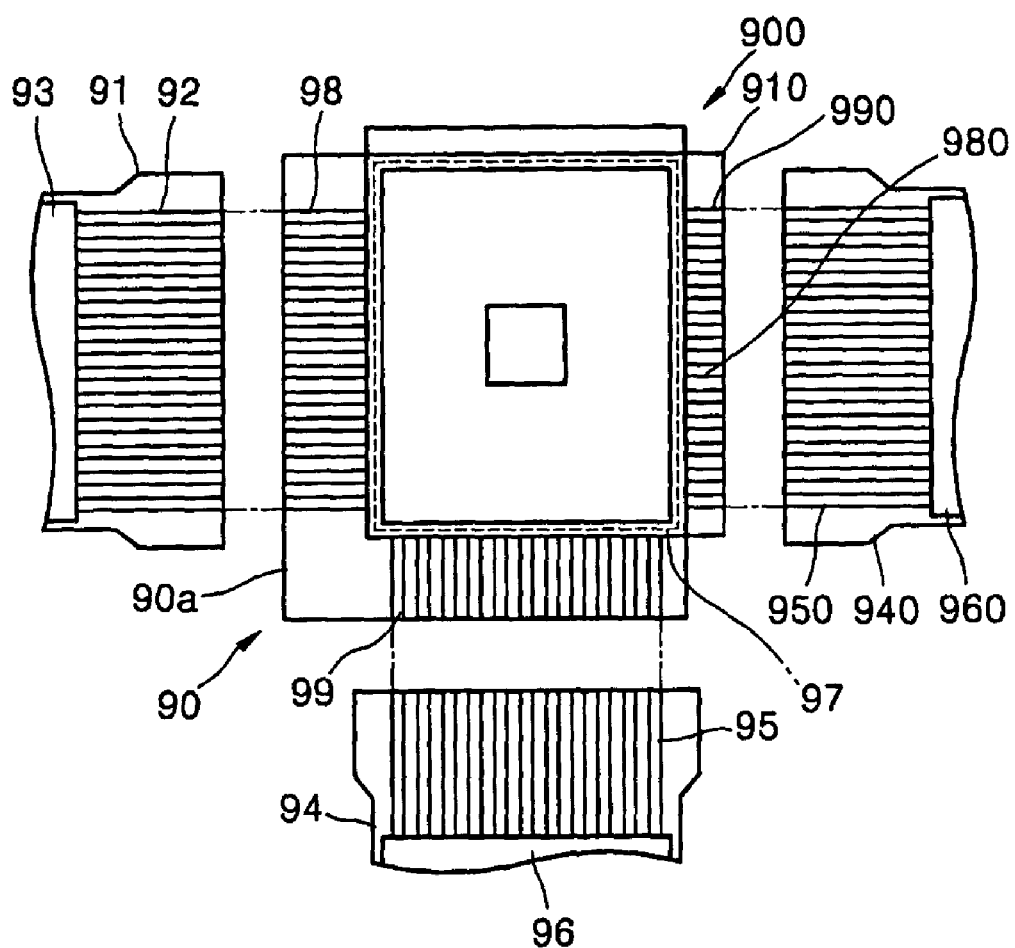
FIG. 9 is a cross-sectional view of a dual-type organic EL display according to yet another embodiment of the present invention.

FIG. 9 is a cross-sectional view of a dual-type organic EL display according to yet another embodiment of the present invention, in which different images are independently driven, like in FIG. 8.

Referring to FIG. 9, the dual-type organic EL display includes a main organic EL device 90 and a sub organic EL device 900 connected to the main organic EL device 90.

The main organic EL device 90 has a main substrate organic light-emitting portion formed on a main substrate 90a. Main substrate scan lines 98 and main substrate data lines 99, perpendicular to the main substrate scan lines 98, are drawn out from the main substrate organic light-emitting portion.

An FPC 91, for main substrate scan lines, is electrically connected to the main substrate scan lines 98. Interconnections 92 for the main substrate scan lines 98 are patterned in the FPC 91, and a drive chip 93 for processing electrical signals is connected to the interconnections 92. An FPC 94 for main substrate data lines is connected to the main substrate data lines 99. Interconnections 95 for main substrate data lines are patterned in the FPC 94, and a drive chip 96 is connected to the interconnections 95.

In the sub organic EL device 900, a sub substrate organic light-emitting portion is formed on a sub substrate 910. Sub substrate scan lines 980 and sub substrate data lines 990 are drawn out from the sub substrate organic light-emitting portion. The sub substrate scan and data lines 980 and 990 are grouped at a first side of the sub substrate 910. Alternatively, the sub substrate scan and data lines 980 and 990 may be grouped at a second side of the sub substrate 910, and are spaced a predetermined distance from the same side.

The sub substrate scan and data lines 980 and 990 are electrically connected to an FPC 940 for sub substrate electrode lines. The FPC 940 includes interconnections 950 for sub substrate electrode lines connected to the sub substrate scan and data lines 980 and 990, and a drive chip 960 connected to the interconnections 950. The sub substrate scan and data lines 980 and 990 are designed so as to be driven by the single drive chip 960.

The main and sub organic EL devices 90 and 900 have a sealant 97 coated along the periphery of an effective display area for connecting the main and sub substrates 90a and 910 to each other. The sealant 97 may include a conductive spacer. However, the conductive spacer is not necessarily included in the sealant 97 because the main and sub electrode lines are not electrically connected to each other in actual practice in this embodiment.

As described above, according to this embodiment of the present invention, like in the embodiment shown in FIG. 8, when the cover of the dual-type organic EL display is closed, an image from the sub organic EL device 900 is driven, and when the cover is opened, an image from the main organic EL device 90 is driven. That is, electrical signals are independently applied to the main and sub organic EL devices 90 and 900 of the dual-type organic EL display.

On the other hand, unlike in the embodiment shown in FIG. 8, the main and sub substrate data lines 99 and 990 can be independently driven, and the main and sub substrate scan lines 98 and 980 can also be independently driven.

Figure 10A:
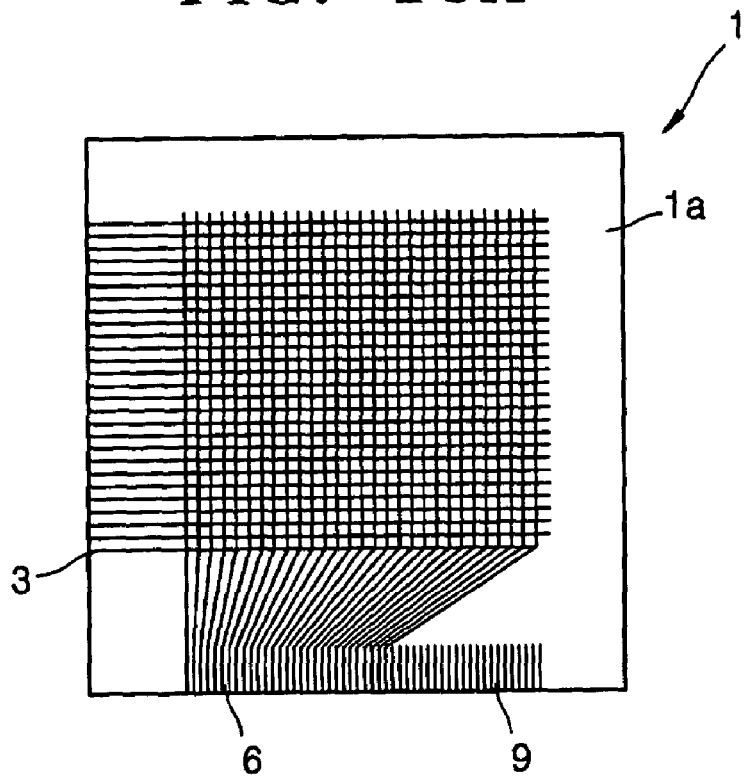
FIG. 10A is a schematic diagram of electrode lines of a main organic EL device according to yet another embodiment of the present invention.
Figure 10B:
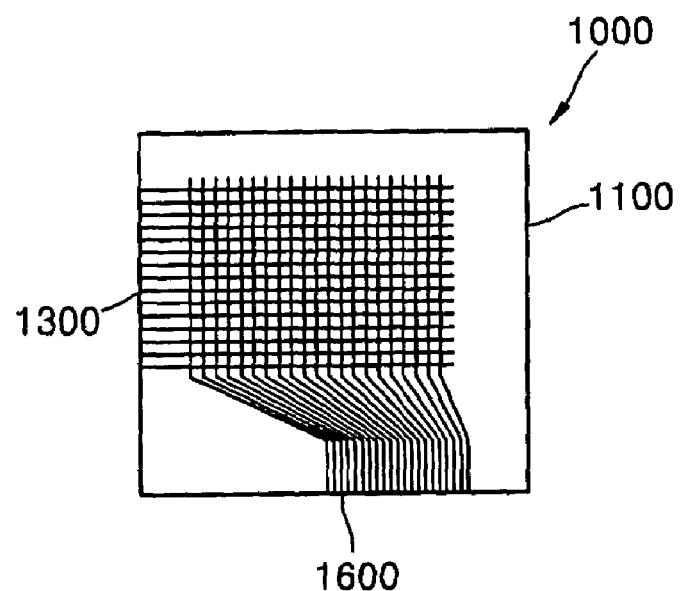
FIG. 10B is a schematic diagram of electrode lines of a sub organic EL device according to the embodiment of of FIG. 10A.

FIG. 10A is a schematic diagram of electrode lines of a main organic EL device according to yet another embodiment of the present invention, and FIG. 10B is a schematic diagram of electrode lines of a sub organic EL device according to this embodiment of the present invention. Now, only electrode lines formed on substrates of main and sub organic EL devices 1 and 1000 will be described.

Referring to FIGS. 10A and 10B, strip-shaped main substrate scan lines 3 are spaced a predetermined distance from each other on a main substrate 1a of a main organic EL device 1, and main substrate data lines 6 are arranged in a direction perpendicular to the main substrate scan lines 3.

Here, floating electrode lines 9 are spaced a predetermined distance apart from each other on the main substrate 1a. The floating electrode lines 9 are arranged on the main substrate 1a so as to be disposed adjacent to the main substrate data lines 6. The floating electrode lines 9 are not directly connected to, but are separately patterned from, the electrode lines on the main substrate 1a.

To this end, the main substrate data lines 6, spaced apart from each other in a narrow pitch, are grouped at a first side of the main substrate 1a. In this manner, the main substrate data lines 6 are disposed on the main substrate 1a in a narrow pitch and a free space of the main substrate 1a is occupied by the floating electrode lines 9.

On a sub substrate 1100 of the sub organic EL device 1000, strip-shaped sub substrate scan lines 1300 are spaced a predetermined distance apart from each other. Sub substrate data lines 1600 are arranged in a direction perpendicular to the sub substrate scan lines 1300. The sub scan and data lines 1300 and 1600 are formed in directions parallel to those of the main substrate scan and data lines 3 and 6, respectively.

Here, the sub substrate data lines 1600 are grouped at a first side of the sub substrate 1100 to be electrically connected to the floating electrode lines 9. That is to say, during patterning of electrodes, the sub substrate data lines 1600 are formed so as to correspond to the floating electrode lines 9. In this manner, the floating electrode lines 9 are formed on the main substrate 1a for the purpose of receiving external drive signals from the main substrate 1a.

In the dual-type organic EL display having the above-described configuration, the sealant having a conductive spacer is coated along the periphery of an effective display area, so that the main substrate scan lines 3 and the sub substrate scan lines 1300 are selectively electrically connected, and an FPC for scanning may also be connected to the main or sub substrate scan lines. Also, a sealant including a conductive spacer may be coated between the floating electrode lines 9 and the sub substrate data lines 1600 for an electrical connection.

Therefore, the respective electrode lines are arranged on the main substrate 1a and an FPC having a drive chip mounted thereon is connected to the electrode lines, thereby applying a signal for independently or simultaneously driving images.

As described above, the manufacturing method of the dual-type organic EL display according to the present invention has the following effects.

Since the main and sub organic EL devices have an effective display area sealed by a sealant including an anisotropic conductive spacer, the thicknesses thereof can be reduced. Also, main substrate scan and data lines, formed on a main substrate, and sub substrate scan and data lines, formed on a sub substrate, are selectively electrically connected to each other by the anisotropic conductive spacer, and therefore the number of drive chips transmitting electrical signals to the electrode lines can be greatly reduced. Accordingly, the thickness of an organic EL display can be remarkably reduced. Also, an improved driving method according to the present invention can reduce the cost.

Further, FPCs driving main and sub organic EL devices are attached to either a main or sub substrate using a sealant including a conductive spacer, thereby improving workability.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A dual-type organic electroluminescence (EL) display comprising:
    a main organic EL device comprising:
        a main substrate,
        strip-shaped main substrate scan lines,
        a main substrate organic light-emitting portion, and
        main substrate data lines formed on the main substrate;
    a sub organic EL device opposite to and facing the main organic EL device, comprising:
        a sub substrate,
        strip-shaped sub substrate scan lines,
        a sub substrate organic light-emitting portion, and
        sub substrate data lines formed on the sub substrate;
    a sealant comprising a conductive spacer, sealing the main and sub substrates and hermetically sealing the main and sub substrate organic light-emitting portions in a state in which the main and sub organic EL devices face each other; and
    at least one flexible printed cable (FPC) formed on the main or sub substrate and connected to electrode lines of the main and/or sub substrates.

2. The dual-type organic EL display of claim 1, wherein the main substrate scan lines and the main substrate data lines are arranged on the main substrate, the sub substrate scan lines and the sub substrate data lines are arranged on the sub substrate, and the sealant is interposed between the main and sub substrate scan lines and between the main and sub substrate data lines.

3. The dual-type organic EL display of claim 2, wherein the main substrate scan lines are electrically connected to the sub substrate scan lines by the conductive spacer.

4. The dual-type organic EL display of claim 3, wherein the at least one FPC comprises an FPC for single substrate scan lines electrically connected to the main or sub substrate scan lines, and transmitting a drive signal to the main or sub substrate scan lines.

5. The dual-type organic EL display of claim 2, wherein the main substrate data lines are electrically connected to the sub substrate data lines by the conductive spacer.

6. The dual-type organic EL display of claim 5, wherein the at least one FPC comprises an FPC for single substrate data lines electrically connected to the main or sub substrate data lines, and transmitting a drive signal to the main or sub substrate data lines.

7. The dual-type organic EL display of claim 2, wherein the at least one FPC comprises FPCs for main substrate scan and data lines connected to the main substrate scan and data lines, respectively, and FPCs for sub substrate scan and data lines connected to the sub substrate scan and data lines, respectively.

8. The dual-type organic EL display of claim 1, wherein the main substrate scan lines are electrically connected to the sub substrate scan lines by the conductive spacer.

9. The dual-type organic EL display of claim 8, wherein the conductive spacer comprises an anisotropic conductive material which is electrified vertically and insulated horizontally.

10. The dual-type organic EL display of claim 8, wherein the at least one FPC comprises an FPC for sub substrate data lines electrically connected to the sub substrate data lines, and transmitting a drive signal to sub substrate data lines.

11. The dual-type organic EL display of claim 1, wherein the at least one FPC comprises an FPC for single substrate scan lines electrically connected to the main or sub substrate scan lines, and transmitting a drive signal to the main or sub substrate scan lines.

12. The dual-type organic EL display of claim 1, wherein the main substrate scan lines are grouped at a first side of the main substrate and the main substrate data lines are arranged at a second side of the main substrate.

13. The dual-type organic EL display of claim 12, wherein the sub substrate scan lines are arranged on the sub substrate parallel to the main substrate scan lines, and the sub substrate data lines are arranged on the sub substrate parallel to the main substrate data lines.

14. The dual-type organic EL display of claim 1, wherein the conductive spacer comprises an anisotropic conductive material which is electrified vertically and insulated horizontally.

15. The dual-type organic EL display of claim 1, wherein the main substrate scan lines and the sub substrate scan lines are electrically connected to each other by the conductive spacer, and are connected to the FPC applying an identical scan line drive signal to the main substrate scan lines and the sub substrate scan lines.

16. The dual-type organic EL display of claim 1, wherein the main substrate data lines and the sub substrate data lines are electrically connected to each other by the conductive spacer, and are connected to the FPC applying an identical data line drive signal to the main substrate data lines and the sub substrate data lines.

17. A dual-type organic electroluminescence (EL) display comprising:
  a main organic EL device comprising:
    a main substrate,
    strip-shaped main substrate scan lines,
    a main substrate organic light-emitting portion, and
    main substrate data lines formed on the main substrate;
  a sub organic EL device opposite to and facing the main organic EL device, comprising:
    a sub substrate,
    strip-shaped sub substrate scan lines,
    a sub substrate organic light-emitting portion, and
    sub substrate data lines formed on the sub substrate;
  a sealant comprising a conductive spacer, sealing the main and sub substrates and hermetically sealing the main and sub substrate organic light-emitting portions in a state in which the main and sub organic EL devices face each other;
  floating electrode lines formed on the main or sub substrate and connected to electrode lines on the remaining main or sub substrate; and
  at least one flexible printed cable (FPC) connected to the main and/or sub substrate;
  wherein a plurality of the electrode lines on the main and sub substrates are electrically connected to each other by the conductive spacer.

18. The dual-type organic EL display of claim 17, wherein the floating electrode lines are independently arranged at a first side of the main or sub substrate electrode lines.

19. The dual-type organic EL display of claim 18, wherein a pitch between each of the main or sub substrate electrode lines formed on the substrate with the floating electrode lines is smaller than that between each of the electrode lines formed on the substrate without the floating electrode lines.

20. The dual-type organic EL display of claim 17, wherein the conductive spacer comprises an anisotropic conductive material which is electrified vertically and insulated horizontally.

21. The dual-type organic EL display of claim 17, wherein the main substrate electrode lines and the sub substrate electrode lines electrically connected to each other are connected to the at least one FPC.

22. A method of manufacturing a dual-type organic EL display comprising:
  preparing a main organic EL device by forming main substrate scan lines, a main substrate insulating layer, a main substrate organic layer, and main substrate data lines crossing the main substrate scan lines on a transparent main substrate;
  preparing a sub organic EL device by forming sub substrate scan lines, a sub substrate insulating layer, a sub substrate organic layer, and sub substrate data lines crossing the sub substrate scan lines on a transparent sub substrate;
  aging the main and sub organic EL devices;
  hermetically sealing the main and sub organic EL devices, via a sealant provided with a conductive spacer, along the periphery of an effective display area of the main and sub organic EL devices so as not to be exposed outside; and
  connecting flexible printed cables (FPCs) transmitting a drive signal to at least one of the main and sub substrate scan lines and/or at least one of the main and sub substrate data lines electrically connected to each other by the sealant.

23. The method of claim 22, wherein the conductive spacer is interposed between each of the main and sub substrate scan lines and/or the main and sub substrate data lines, forming the electrical connection there between.

24. The method of claim 22, wherein in the connecting of the FPCs, the electrically connected main and sub substrate scan lines or main and sub substrate data lines are connected to FPCs on one of the main and sub substrates.

25. A dual-type organic electroluminescence (EL) display comprising:
   a main organic EL device with a first light-emitting portion;
   a sub organic EL device with a second light-emitting portion;
   a sealing unit provided with a conductive spacer; and
   at least one flexible printed cable (FPC) coupled to the main or sub organic EL device;
   wherein the sealing unit hermetically seals the light-emitting portions facing each other, with the conductive spacer providing an electrical connection between the main and sub organic EL devices, and signals from the at least one FPC are provided directly to one of the devices, and through the conductive spacer to the remaining device.

26. A dual-type organic electroluminescence (EL) display comprising:
   a main organic EL device with a first light-emitting portion;
   a sub organic EL device with a second light-emitting portion;
   electrode lines formed on each of the EL devices;
   floating electrode lines formed on the main or sub EL device;
   a sealing unit; and
   at least one flexible printed cable (FPC) coupled to the main or sub organic EL device;
   wherein the floating electrode lines send signals received from the at least one FPC to a plurality of the electrode lines on the device not having the floating electrode lines.

27. The dual-type organic EL display of claim 26, further comprising a conductive spacer in the sealing unit, wherein a plurality of the electrode lines of each device are electrically connected to each other through the conductive spacer.

28. The dual-type organic EL display of claim 27, wherein the electrically connected electrode lines of one of the devices receives signals from the at least one FPC coupled to the other device.

* * * * *